(12) United States Patent
Kim

(10) Patent No.: US 6,504,425 B1
(45) Date of Patent: Jan. 7, 2003

(54) METHOD AND APPARATUS FOR MODELING AND ESTIMATING THE CHARACTERISTICS OF A POWER AMPLIFIER BY RETAINING EVEN-ORDER TERMS IN ESTIMATING CHARACTERISTICS

(75) Inventor: Jaehyeong Kim, Pine Brook, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/876,696

(22) Filed: Jun. 7, 2001

(51) Int. Cl.$^7$ .............................................. G01R 19/00
(52) U.S. Cl. ............................. 330/2; 330/149; 375/297
(58) Field of Search ....................... 330/2, 149; 379/297

(56) References Cited

U.S. PATENT DOCUMENTS 5,900,778 A * 5/1999 Stonick et al. .............. 330/149
6,236,837 B1 * 5/2001 Midya ........................... 455/63
6,313,703 B1 * 11/2001 Wright et al. ................ 330/149

* cited by examiner

*Primary Examiner*—Robert Pascal
*Assistant Examiner*—Henry Choe
(74) *Attorney, Agent, or Firm*—Harness, Dickey & Pierce, P.L.C.

(57) ABSTRACT

Disclosed is an apparatus and method for modeling and estimating the characteristics of a power amplifier. A predistortion module generates a predistorted signal in response to a predistortion function and an input signal. A power amplifier receives the predistorted signal and generates an output signal. A polynomial module generates coefficients of a complex polynomial of order p (p is an integer greater than one) in response to the predistorted signal and the output signal. In particular, the complex polynomial is implemented with both even and odd terms, thereby improving the ability to accurately model the power amplifier.

6 Claims, 2 Drawing Sheets

METHOD AND APPARATUS FOR MODELING AND ESTIMATING THE CHARACTERISTICS OF A POWER AMPLIFIER BY RETAINING EVEN-ORDER TERMS IN ESTIMATING CHARACTERISTICS

RELATED APPLICATIONS

The present patent application is related to U.S. patent application Ser. No. 09/876,772, entitled, "METHOD AND APPARATUS FOR MODELING AND ESTIMATING THE CHARACTERISTICS OF A POWER AMPLIFIER", being concurrently filed herewith and having a filing date of Jun. 7, 2001; to U.S. patent application Ser. No. 09/878,037, entitled, "METHOD AND APPARATUS FOR CALCULATING THE PREDISTORTION FUNCTION FROM A POWER AMPLIFIER", being concurrently filed herewith and having a filing date of Jun. 8, 2001; and to U.S. patent application Ser. No. 09/878,038, entitled, "METHOD AND APPARATUS FOR CALCULATING THE PREDISTORTION FUNCTION FROM A POWER AMPLIFIER", being concurrently filed herewith and having a filing date of Jun. 8, 2001; all of which have a common inventor and assignee and being incorporated herein by reference.

FIELD OF THE INVENTION

This invention relates generally to signal amplification and, in particular, to determining signal amplifier characteristics for intentionally induced distortion techniques utilized prior to and in conjunction with signal amplification.

BACKGROUND OF THE INVENTION

In the field of radio communication systems, it is a well-known problem that the power amplifiers present in transmission equipment operate in a non-linear fashion when the power amplifiers are operated near their peak output. As a result, the power amplifier introduces significant signal distortion that can appear in various forms. For example, if more than one signal is input into the power amplifier or power amplification stage, its non-linear characteristics can cause an undesirable multiplicative interaction of the signals being amplified, and the power amplifier's output can contain intermodulation products. These intermodulation products cause interference and crosstalk over the power amplifier's operational frequency range.

In power amplifier design, there is a trade off between distortion performance and efficiency. Linear amplifiers that operate under "Class A" conditions create little distortion but are inefficient, whereas non-linear amplifiers operated under "Class C" conditions are reasonably efficient but introduce significant distortions. While both efficiency and distortion are important considerations in amplifier design, efficiency becomes increasingly important at high power levels. Because of their efficiency, non-linear amplifiers are largely preferred, leaving the user with the problem of distortion.

In order to employ non-linear power amplifiers, techniques have been used to improve linearity and thereby reduce the effects of interference and crosstalk. Linearity can be achieved by application of various linearization techniques that reduce the distortion caused by non-linear amplification. Conventional amplifier linearization techniques can be broadly categorized as feedback, feedforward, or predistortion.

The last mentioned technique, predistortion, intentionally distorts the signal before the power amplifier so that the non-linearity of the power amplifier can be compensated. According to this technique, linearization is achieved by distorting an input signal according to a predistortion function in a manner that is inverse to the amplifier characteristic function. The predistortion technique can be applied at radio frequency (RF), intermediate frequency (IF), or at baseband.

In the baseband domain, the input signal information is at a much lower frequency, allowing digital methods to be employed. The predistortion function is applied to the input signal with the resulting predistorted signal being upconverted to IF and then finally to the RF carrier frequency. It is also possible to apply adaptive predistortion techniques where feedback from the output of the amplifier is used to update and correct the predistortion function.

The form of the predistortion function is dependent upon the model used to characterize the output of the amplifier. Predistortion functions in the baseband domain are typically implemented as a table of gain and phase weighting values within a digital signal processor. A Cartesian feedback method employs a quadrature representation of the signal being amplified. The incoming quadrature signals I and Q are compared to the feedback quadrature signals. Thus, there are two sets of coefficients, one for each quadrature channel, that are being updated to model the predistortion characteristics. In this manner, gain and phase non-linearities within the amplifier can be compensated. Performance is dependent on the size of the look up table and the number of bits used to represent the signal. Better performance and more adaptivity is achieved with larger look up tables and more bits albeit at the expense of longer processing times.

Predistortion functions are also modeled as polynomials. Ideal amplifiers have linear characteristics; consequently, amplifiers with slight non-linearities can be modeled as polynomials of only a few terms, with only odd terms being employed. Even terms are discarded because their use with negative-valued inputs can interfere with linearity. While processing demands are eased by excluding and limiting the number of terms in the polynomial modeling, performance is sacrificed.

Accordingly, there is a need for a device to more quickly and efficiently determine the characteristics of a non-linear amplifier.

SUMMARY OF THE INVENTION

The present invention teaches an apparatus and method for modeling and estimating the characteristics of a power amplifier. A predistortion module generates a predistorted signal in response to a predistortion function and an input signal. A power amplifier receives the predistorted signal and generates an output signal. A polynomial module generates coefficients of a complex polynomial of order p (p is an integer greater than one) in response to the predistorted signal and the output signal. The coefficients characterize the power amplifier. The complex polynomial is implemented with both even and odd terms. Even order terms are typically ignored for the polynomial modeling of amplifiers because the non-linear distortion signals caused by power amplifiers are strongest at odd order harmonic frequencies. Additionally, it is commonly thought that the use of even terms with negative valued inputs can interfere with the linearity, since negativity is lost at even powers. However, the inclusion of even order terms improves the ability to accurately model the power amplifier and thereby improves predistortion performance.

In another exemplary embodiment of the present device, the polynomial module employs a minimum mean squared error criteria to determine said polynomial coefficients, thereby allowing a very fast and efficient implementation.

By improving the ability to model power amplifiers, the present invention improves the ability to model the power amplifier predistortion function. The invention further enables power amplifiers to be operated in the non-linear region near saturation, yet suppresses undesirable intermodulation products. Resort to a larger amplifier, to keep operation within the linear region, is avoided. Power amplifier sizes are kept small with associated cost savings, particularly important in the field of wireless communications.

The above factors make the present invention essential for effective power amplifier predistortion.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and the scope of the invention. Thus, the present invention is not intended to be limited to the embodiments disclosed, but is to be accorded the widest scope consistent with the principles and features disclosed herein.

The specification initially discusses the general concept and principles of adaptive digital predistortion in view of the novel system for determining the characteristics of a power amplifier. Exemplary embodiments of the system for determining the characteristics of a power amplifier are then described.

Overview of Adaptive Power Amplifier Predistortion

Figure 1:
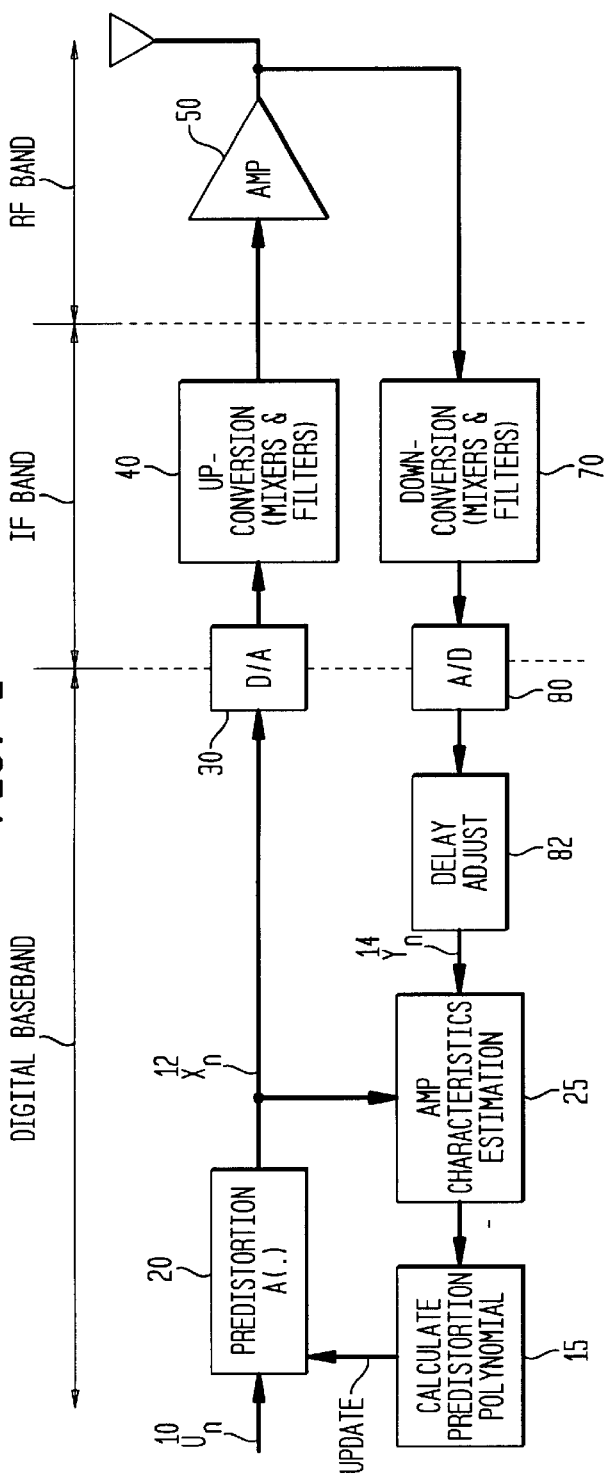
FIG. 1 is a block diagram providing an overview of an exemplary system employing adaptive power amplifier predistortion.

The principal benefit of the present invention is the ability to more efficiently model the power amplifier characteristics in order to improve the ability to employ adaptive digital predistortion (ADPD). The structure of an exemplary ADPD system is seen in FIG. 1. An initial baseband digital signal 10 is identified as $u_n$, where n is the time index. The initial baseband digital signal 10 is fed into a predistortion system 20 that is described as a function $A(\cdot)$. The output of the predistortion system 20 is the baseband digital input signal 12 to the power amplifier 50 and is defined as $x_n$. The baseband digital input signal 12 is processed by a digital to analog (D/A) converter 30 with the resulting baseband analog signal being processed by an up-conversion means 40 that is comprised of mixers and filters and operates in the intermediate frequency (IF) range. The up-conversion means 40 outputs a signal in the radio frequency (RF) range and feeds the signal to the power amplifier 50. While there are many methods for ADPD, the approach with the exemplary invention can be divided into two steps. First, the characteristics of the power amplifier 50 are estimated. Then, the predistortion function based on the power amplifier's 50 characteristics is obtained. For proper characterization of the power amplifier 50, the time domain inputs and outputs of the power amplifier 50 need to be compared. Thus, the output of the power amplifier 50 is tapped and fed back to a down-conversion means 70. Like the up-conversion means 40, the down-conversion means 70 requires mixers and filters in the IF range. The output of the down-conversion means 70 is fed into an analog to digital (A/D) converter 80. The output of the A/D converter 80 is input into a means for delay adjustment 82 with its output representing the baseband digital output signal 14 identified as $y_n$. The baseband digital output signal 14 and the baseband digital input signal 12 are input to the polynomial module 25 in order to determine the coefficients that characterize the power amplifier 50. The output of the polynomial module 25 is coupled to the predistortion polynomial module 15 that determines the predistortion coefficients that are fed into the predistortion module 20. The polynomial module, predistortion polynomial module and predistortion module may be implemented in hardware, or in other forms such as software or firmware.

As implemented in FIG. 1, the baseband digital input signal 12 to the power amplifier 50 as well as the baseband digital output signal 14 of the power amplifier 50 are easily accessible. However, the up-conversion means 40 and the down-conversion means 70 distort the signals. Mixers are non-linear devices and will add non-linear distortions. Furthermore, the phase responses of analog filters are not linear, thereby causing different time delays for different frequency components. Generally, these distortions can be considered negligible or can be corrected by using linear filters, and considered to be part of the baseband model for the power amplifier.

Figure 2:
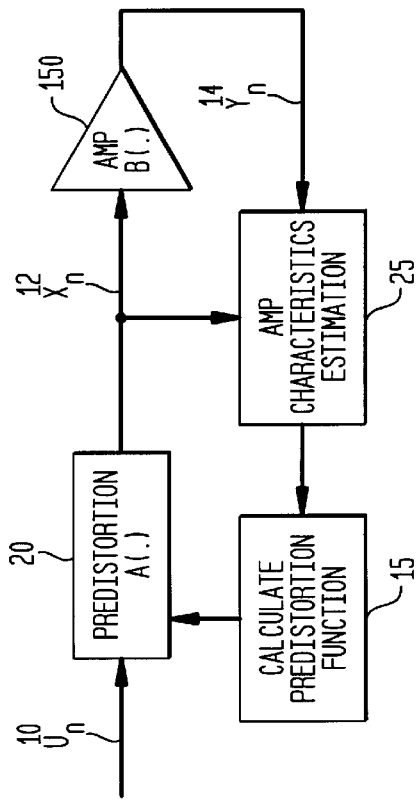
FIG. 2 is a block diagram of the simplified baseband model for power amplifier predistortion.

By neglecting the effect of up-conversion and down-conversion process, the whole predistortion process can be considered in the baseband domain. In FIG. 2, an exemplary baseband model for predistortion processing is illustrated.

The power amplifier 150 is defined as a baseband function $B(\cdot)$ with complex inputs and complex outputs.

Polynomial Modeling of the Power Amplifier

Predistortion requires the information on the characteristics of the power amplifier 150. Proper baseband modeling of the power amplifier 150 is described herein. Since the power amplifier 150 is operating in radio frequency (RF) domain, the baseband model of the power amplifier 150 must be considered in complex numbers. Letting x and y, as previously defined, be the input and output of the power amplifier 150, the following relationships can be defined, $$y = B(\vec{b}, x) \qquad (1)$$
$$= b_1 x + b_2 |x| x + b_3 |x|^2 x + \ldots + b_p |x|^{p-1} x$$

where p is the order of the polynomial, $b_k = b_{kr} + jb_{ki}$, $k \in \{1, 2, \ldots, p\}$ and $\vec{b}$ is a size 2p vector of complex polynomial coefficients defined as $[b_{1r}, b_{2r}, \ldots, b_{pr}, b_{1i}, b_{2i}, \ldots, b_{pi}]$. In general, p=5 is sufficient to model the power amplifier 150.

As seen in equation (1), the complex polynomial is implemented with both even and odd terms, thereby improving the ability to accurately model the power amplifier. Typically, even order terms are ignored for polynomial modeling because the non-linear distortion signals caused by power amplifier are located at odd order harmonic frequencies. Moreover, the use of even order terms is generally bypassed because it is thought that negative-valued inputs can interfere with linearity. However, inclusion of even order terms as seen in the present invention retains the negativity of those terms and allows for better modeling of the power amplifier, thereby improving the predistortion performance.

Estimation of Power Amplifier Characteristics

An estimation is performed in order to obtain an optimum $\vec{b}$ that describes the characteristics of the power amplifier 150. A minimum mean squared error criteria is employed based upon the complex input and output samples of the power amplifier 150. $x_n$ is the input sample and $y_n$ is the corresponding output sample, where $n \in \{1, 2, \ldots, N\}$. The error function $f(\vec{b})$ is defined as $$f(\vec{b}) = E\left[|y_n - B(\vec{b}, x_n)|^2\right] \qquad (2)$$

$$= \frac{1}{N}\sum_{n=1}^{N}|y_n - B(\vec{b}, x_n)|^2$$

$$= \frac{1}{N}\sum_{n=1}^{N}\left(|y_n|^2 - y_n^* B(\vec{b}, x_n) - y_n \cdot B(\vec{b}, x_n)^* + |B(\vec{b}, x_n)|^2\right)$$

where $E[x]$ is the mean of x, and $x^*$ is the complex conjugate of x. Minimizing the error or merit function results in the most accurate modeling of the power amplifier 150 and thereby the optimal polynomial coefficients. From equations (1) and (2), it is known that $f(\vec{b})$ is a quadratic function of $\vec{b}$. Thus, $f(\vec{b})$ can be expressed by a Taylor series as $$f(\vec{b}+\vec{d}) = f(\vec{b}) + \nabla f(\vec{b}) \cdot \vec{d}^{t} + \tfrac{1}{2}\vec{d} \cdot H(\vec{b}) \cdot \vec{d}^t \qquad (3)$$

where "t" is the transpose of the matrix, and $\nabla f(\vec{b})$ is the gradient of $f(\vec{b})$, defined as $$\nabla f(\vec{b}) \equiv \left[\frac{\partial f}{\partial b_{1r}}, \frac{\partial f}{\partial b_{2r}}, \ldots, \frac{\partial f}{\partial b_{pr}}, \frac{\partial f}{\partial b_{1i}}, \frac{\partial f}{\partial b_{2i}}, \ldots, \frac{\partial f}{\partial b_{pi}}\right] \qquad (4)$$

$H(\vec{b})$ is the Hessian or second order derivative of $f(\vec{b})$, and is defined as $$H(\vec{b}) \equiv \begin{bmatrix} \frac{\partial^2 f}{\partial b_{1r}^2} & \frac{\partial^2 f}{\partial b_{1r}\partial b_{2r}} & \cdots & \frac{\partial^2 f}{\partial b_{1r}\partial b_{pr}} & \frac{\partial^2 f}{\partial b_{1r}\partial b_{1i}} & \frac{\partial^2 f}{\partial b_{1r}\partial b_{2i}} & \cdots & \frac{\partial^2 f}{\partial b_{1r}\partial b_{pi}} \\ \frac{\partial^2 f}{\partial b_{2r}^2} & \frac{\partial^2 f}{\partial b_{2r}\partial b_{2r}} & \cdots & \frac{\partial^2 f}{\partial b_{2r}\partial b_{pr}} & \frac{\partial^2 f}{\partial b_{2r}\partial b_{1i}} & \frac{\partial^2 f}{\partial b_{2r}\partial b_{2i}} & \cdots & \frac{\partial^2 f}{\partial b_{2r}\partial b_{pi}} \\ \vdots & \vdots & & \vdots & \vdots & \vdots & & \vdots \\ \frac{\partial^2 f}{\partial b_{pr}^2} & \frac{\partial^2 f}{\partial b_{pr}\partial b_{2r}} & \cdots & \frac{\partial^2 f}{\partial b_{pr}\partial b_{pr}} & \frac{\partial^2 f}{\partial b_{pr}\partial b_{1i}} & \frac{\partial^2 f}{\partial b_{pr}\partial b_{2i}} & \cdots & \frac{\partial^2 f}{\partial b_{pr}\partial b_{pi}} \\ \frac{\partial^2 f}{\partial b_{1i}^2} & \frac{\partial^2 f}{\partial b_{1i}\partial b_{2r}} & \cdots & \frac{\partial^2 f}{\partial b_{1i}\partial b_{pr}} & \frac{\partial^2 f}{\partial b_{1i}\partial b_{1i}} & \frac{\partial^2 f}{\partial b_{1i}\partial b_{2i}} & \cdots & \frac{\partial^2 f}{\partial b_{1i}\partial b_{pi}} \\ \frac{\partial^2 f}{\partial b_{2i}^2} & \frac{\partial^2 f}{\partial b_{2i}\partial b_{2r}} & \cdots & \frac{\partial^2 f}{\partial b_{2i}\partial b_{pr}} & \frac{\partial^2 f}{\partial b_{2i}\partial b_{1i}} & \frac{\partial^2 f}{\partial b_{2i}\partial b_{2i}} & \cdots & \frac{\partial^2 f}{\partial b_{2i}\partial b_{pi}} \\ \vdots & \vdots & & \vdots & \vdots & \vdots & & \vdots \\ \frac{\partial^2 f}{\partial b_{pi}^2} & \frac{\partial^2 f}{\partial b_{pi}\partial b_{2r}} & \cdots & \frac{\partial^2 f}{\partial b_{pi}\partial b_{pr}} & \frac{\partial^2 f}{\partial b_{pi}\partial b_{1i}} & \frac{\partial^2 f}{\partial b_{pi}\partial b_{2i}} & \cdots & \frac{\partial^2 f}{\partial b_{pi}\partial b_{pi}} \end{bmatrix} \qquad (5)$$

Since $f(\vec{b})$ is a quadratic function, it has a global minimum if $H(\vec{b})$ is a positive definite matrix. By the same reason, the Hessian is not the function of $\vec{b}$ and the notation of H can be used instead of $H(\vec{b})$. The estimation obtains the optimum $\vec{b}_{opt}$ that makes $f(\vec{b}_{opt})$ on its minimum. Using the Newton Method, the optimum $\vec{b}_{opt}$ can be obtained. Letting $\vec{b}_0$ be an initial value, then $\vec{b}_{opt}$ can be expressed as $$f\vec{b}_{opt} = \vec{b}_0 + \vec{d} \qquad (6)$$

Equation (3) can then be re-written as $$f(\vec{b}_{opt}) = f(\vec{b}_0 + \vec{d}) = f(\vec{b}_0) + \nabla f(\vec{b}_0) \cdot \vec{d}^t + \tfrac{1}{2}\vec{d} \cdot H \cdot \vec{d}^t \qquad (7)$$

If H is a positive definite matrix, the optimum $\vec{d}$ is found by making the gradient of $f(\vec{b}_0 + \vec{d})$ based on $\vec{d}$ equal zero.

$$\vec{d} = -H^{-1} \cdot \nabla f(\vec{b}_0) \qquad (8)$$

Thus, the optimum polynomial coefficients $\vec{b}_{opt}$ is $$\vec{b}_{opt} = \vec{b}_0 - H^{-1} \cdot \nabla f(\vec{b}_0) \qquad (9)$$

The gradient of $f(\vec{b}_0)$ is calculated from equations (1), (2), and (4).

$$\nabla f(\vec{b}_o) = \nabla\left(\frac{1}{N}\sum_{n=1}^{N}|y_n - B(\vec{b}_o, x_n)|^2\right) \qquad (10)$$

Where R[x] and I[x] are the real components of x and the imaginary component of x, respectively. From the results, $$\nabla B(\vec{b}_{01}, x_n) = [x_n, |x_n|x_n, \ldots, |x_n|^{p-1}x_n, jx_n, j|x_n|x_n, \ldots j|x_n|^{p-1}x_n] \quad (11)$$

then, $$\nabla f(\vec{b_o}) = \begin{bmatrix} b_{o1r}M_2 + b_{o2r}M_3 + \ldots + b_{opr}M_{p+1} - \Re[C_1] \\ b_{o1r}M_3 + b_{o2r}M_4 + \ldots + b_{opr}M_{p+2} - \Re[C_2] \\ \vdots \\ b_{o1r}M_{p+1} + b_{o2r}M_{p+2} + \ldots + b_{opr}M_{2p} + \Re[C_p] \\ b_{o1i}M_2 + b_{o2i}M_3 + \ldots + b_{opi}M_{p+1} + \Im[C_1] \\ b_{o1i}M_3 + b_{o2i}M_4 + \ldots + b_{opi}M_{p+2} + \Im[C_2] \\ \vdots \\ b_{o1i}M_{p+1} + b_{o2i}M_{p+2} + \ldots + b_{opi}M_{2p} + \Im[C_p] \end{bmatrix}^t \quad (12)$$

where $$M_k \equiv \frac{2}{N}\sum_{n=1}^{N}|x_n|^k \quad (13)$$

$$C_k \equiv \frac{2}{N}\sum_{n=1}^{N}|x_n|^{k-1} \cdot x_n \cdot y_n^* \quad (14)$$

Thus, the Hessian of $f(\vec{b_o})$ $$H = \frac{2}{N}\sum_{n=1}^{N}\begin{bmatrix} |x_n|^2 & |x_n|^3 & \cdots & |x_n|^{p+1} & 0 & 0 & \cdots & 0 \\ |x_n|^3 & |x_n|^4 & \cdots & |x_n|^{p+2} & 0 & 0 & \cdots & 0 \\ \vdots & \vdots & \cdots & \vdots & \vdots & \vdots & \cdots & \vdots \\ |x_n|^{p+1} & |x_n|^{p+2} & \cdots & |x_n|^{2p} & 0 & 0 & \cdots & 0 \\ 0 & 0 & \cdots & 0 & |x_n|^2 & |x_n|^3 & \cdots & |x_n|^{p+1} \\ 0 & 0 & \cdots & 0 & |x_n|^3 & |x_n|^4 & \cdots & |x_n|^{p+2} \\ \vdots & \vdots & \cdots & \vdots & \vdots & \vdots & \cdots & \vdots \\ 0 & 0 & \cdots & 0 & |x_n|^{p+1} & |x_n|^{p+2} & \vdots & |x_n|^{2p} \end{bmatrix} \quad (15)$$

Defining a p×p matrix K as $$K \equiv \begin{bmatrix} M_2 & M_3 & \cdots & M_{p+1} \\ M_3 & M_4 & \cdots & M_{p+2} \\ \vdots & \vdots & \cdots & \vdots \\ M_{p+1} & M_{p+2} & \cdots & M_{2p} \end{bmatrix} \quad (16)$$

The Hessian can now be expressed in terms of K.

$$H = \begin{bmatrix} K & 0 \\ 0 & K \end{bmatrix} \quad (17)$$

Where 0 is a zero matrix of size p×p. Finally, the Inverse Hessian can be obtained as $$H^{-1} = \begin{bmatrix} K^{-1} & 0 \\ 0 & K^{-1} \end{bmatrix} \quad (18)$$

Figure 3:
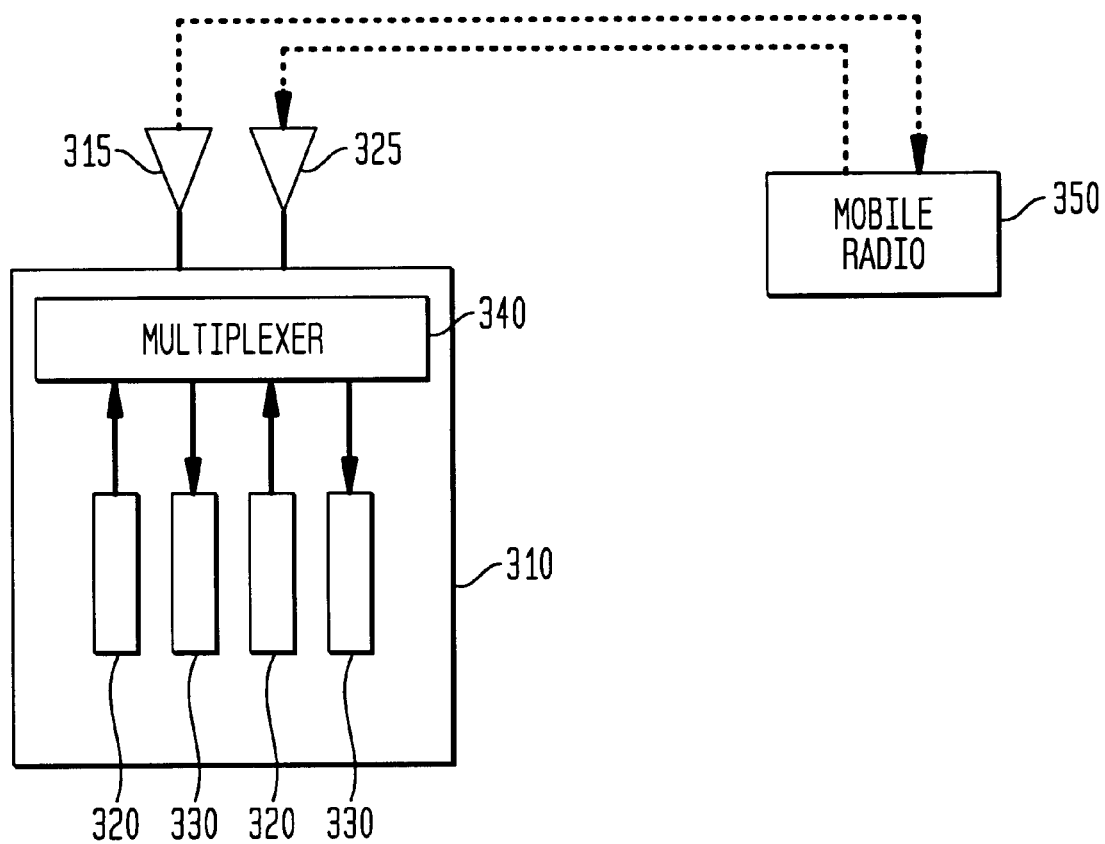
FIG. 3 is a block diagram illustrating the device of FIG. 2 as used in a RF transmission system in accordance with the principles of the present invention.

FIG. 3 illustrates a base station 310 with power amplifiers employing a predistortion linearization technique in accordance with the principles of the present invention.

As shown in FIG. 3, base station 310 comprises a pair of transmitters 320 each having a power amplifier as shown in FIG. 2. Base station 310 can comprise, if necessary, a single transmitter or additional transmitters. In addition, base station 310 includes a suitable transmit antenna 315 for transmission in a RF transmission system that comprises both wireless and wired equipment. Base station 310 can utilize any equipment suitable for sending and receiving RF transmissions, such as those employing Code Division Multiple Access (CDMA) communications. In FIG. 3, a mobile radio 350 is shown as well as the base station 310 including a receive antenna 325, a pair of receivers 330 and a multiplexer 340. Additional mobile radios may be serviced by the base station 310, and it will be apparent to one of ordinary skill that base station 310 can be used for providing wireless communications in any desired manner and for any type of wireless communications protocol or standard.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed is:

1. An apparatus for modeling and estimating the characteristics of a power amplifier, comprising:

a predistortion module responsive to a predistortion function and an input signal by generating a predistorted signal;

the power amplifier responsive to said predistorted signal by generating an output signal; and a polynomial module responsive to said predistorted signal and said output signal by generating coefficients of a complex polynomial of order p (p is an integer greater than one), said complex polynomial having both even order terms and odd order terms, both of said even and odd order terms being used by said polynomial module to model said power amplifier.

2. The apparatus according to claim 1, wherein said polynomial module employs a minimum mean squared error criteria to determine said polynomial coefficients.

3. A wireless radio frequency communications system including an apparatus for modeling and estimating the characteristics of a power amplifier, said system comprising:

a predistortion module responsive to a predistortion function and an input signal by generating a predistorted signal;

the power amplifier responsive to said predistorted signal by generating an output signal; and a polynomial module responsive to said predistorted signal and said output signal by generating coefficients of a complex polynomial of order p (p is an integer greater than one), said complex polynomial having both even order terms and odd order terms, both of said even and odd order terms being used by said polynomial module to model said power amplifier.

4. The system of claim 3, wherein said polynomial module employs a minimum mean squared error criteria to determine said polynomial coefficients.

5. A method for modeling and estimating the characteristics of a power amplifier, comprising:

generating a predistorted signal in response to a predistortion function and an input signal;

amplifying said predistorted signal to generate an output signal; and generating coefficients of a complex polynomial of order p (p is an integer greater than one), in response to said predistorted signal and said output signal, said complex polynomial having both even order terms and odd order terms, both of said even and odd order terms being used to model said power amplifier.

6. The method according to claim 5, wherein said coefficients generating step employs a minimum mean squared error criteria to determine said polynomial coefficients.

* * * * *